United States Patent
Senoo

(10) Patent No.: US 9,000,478 B2
(45) Date of Patent: Apr. 7, 2015

(54) VERTICAL IGBT ADJACENT A RESURF REGION

(75) Inventor: Masaru Senoo, Okazaki (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 279 days.

(21) Appl. No.: 13/480,074

(22) Filed: May 24, 2012

(65) Prior Publication Data

US 2013/0015493 A1    Jan. 17, 2013

(30) Foreign Application Priority Data

Jul. 11, 2011 (JP) ................................ 2011-152661

(51) Int. Cl.
| | | |
|---|---|---|
| *H01L 29/739* | (2006.01) | |
| *H01L 29/78* | (2006.01) | |

(Continued)

(52) U.S. Cl.
CPC ...... *H01L 29/7811* (2013.01); *H01L 29/66333* (2013.01); *H01L 29/0696* (2013.01); *H01L 29/063* (2013.01); *H01L 29/66348* (2013.01); *H01L 29/7395* (2013.01); *H01L 29/7397* (2013.01); *H01L 29/7813* (2013.01); *H01L 29/8611* (2013.01); *H01L 29/0615* (2013.01); *H01L 29/0878* (2013.01); *H01L 29/1095* (2013.01)

(58) Field of Classification Search
CPC .............. H01L 29/063; H01L 29/0696; H01L 29/66333; H01L 29/66348; H01L 29/7395; H01L 29/7397
USPC .......... 257/133, 492, 493, E29.027, E29.066, 257/E29.197, E29.198, E29.201, E21.382, 257/E21.383, E21.384; 438/138

See application file for complete search history.

(56) References Cited

U.S. PATENT DOCUMENTS

| | | |
|---|---|---|
| 2002/0030225 A1 | 3/2002 | Nakamura et al. |
| 2007/0222023 A1 | 9/2007 | Schmidt |
| 2008/0012040 A1 | 1/2008 | Saito et al. |

FOREIGN PATENT DOCUMENTS

| | | |
|---|---|---|
| JP | A-04-127540 | 4/1992 |
| JP | A-07-193018 | 7/1995 |

(Continued)

OTHER PUBLICATIONS

English machine translation of JP2008-227238A of record.*

(Continued)

*Primary Examiner* — Tom Thomas
*Assistant Examiner* — Christopher M Roland
(74) *Attorney, Agent, or Firm* — Oliff PLC

(57) ABSTRACT

A semiconductor apparatus includes a substrate having a device region and a peripheral region located around the device region. A first semiconductor region is formed within the device region, is of a first conductivity type, and is exposed at an upper surface of the substrate. Second-fourth semiconductor regions are formed within the peripheral region. The second semiconductor region is of the first conductivity type, has a lower concentration of the first conductivity type of impurities, is exposed at the upper surface, and is consecutive with the first semiconductor region directly or indirectly. The third semiconductor region is of a second conductivity type, is in contact with the second semiconductor region from an underside, and is an epitaxial layer. The fourth semiconductor region is of the second conductivity type, has a lower concentration of the second conductivity type of impurities, and is in contact with the third semiconductor region from an underside.

14 Claims, 12 Drawing Sheets

(51) Int. Cl.
*H01L 29/66* (2006.01)
*H01L 29/06* (2006.01)
*H01L 29/861* (2006.01)
*H01L 29/08* (2006.01)
*H01L 29/10* (2006.01)

(56) References Cited

FOREIGN PATENT DOCUMENTS

| JP | A-07-273325 | 10/1995 |
| JP | A-2001-015741 | 1/2001 |
| JP | A-2008-227238 | 9/2008 |
| JP | A-2008-227240 | 9/2008 |
| WO | WO 2005/109521 A1 | 11/2005 |
| WO | WO 2012/063310 A1 | 5/2012 |

OTHER PUBLICATIONS

Japanese Office Action issued in Application No. 2011-152661; Dated May 21, 2013 (With Translation).

* cited by examiner

VERTICAL IGBT ADJACENT A RESURF REGION

CROSS-REFERENCE TO RELATED APPLICATION

This application claims priority to Japanese Patent Application No. 2011-152661 filed on Jul. 11, 2011, the contents of which are hereby incorporated by reference into the present application.

TECHNICAL FIELD

The techniques disclosed in this specification relate to a semiconductor apparatus including a device region in which a vertical type semiconductor device is formed and a peripheral region located around the device region.

DESCRIPTION OF RELATED ART

FIG. 13 shows a semiconductor apparatus disclosed in Japanese Patent Application Publication No. 2008-227238. As shown in FIG. 13, a semiconductor substrate of this semiconductor apparatus comprises a device region 600 in which a vertical IGBT is formed and a peripheral region 650 located around the device region. An IGBT is formed within the device region 600. A body region 602 is formed in a range exposed at an upper surface of the semiconductor substrate within the device region 600. Formed within the peripheral region 650 is a RESURF region 652 which is a p-type region, which has a concentration of p-type impurities lower than a concentration of the p-type impurities in the body region 602, which is exposed at the upper surface of the semiconductor substrate, and which is consecutive with the body region 602. An n-type region 654 having a high concentration of n-type impurities is formed under the RESURF region 652. A drift region 656 having a concentration of the n-type impurities lower than the concentration of the n-type impurities in the n-type region 654 is formed under the n-type region 654. The RESURF region 652 promotes extension of a depletion layer from the body region 602 toward a side surface of the semiconductor substrate while the IGBT is in an off state. Accordingly, electric field concentration in a vicinity of the body region 602 is suppressed.

BRIEF SUMMARY

As shown in FIG. 13, an adherence of an electric charge 680 to an upper surface of the peripheral region 650 may cause a disturbance in an electric field distribution within the RESURF region 652 in a vicinity of the upper surface of the peripheral region 650. When an electric charge adheres to the upper surface of the peripheral region 650 in a state where a high electric field is generated at an upper end of the RESURF region 652, a high electric field is likely to be generated locally within the RESURF region 652 due to a disturbance in the electric field. Therefore, the peripheral region 650 favorably has a structure in which a high electric field is less likely to be generated at the upper end of the RESURF region 652.

FIG. 14 shows an electric field distribution that is predicted to be generated within the semiconductor apparatus shown in FIG. 13 while the IGBT is in the off state. FIG. 14 shows the electric field distribution within the RESURF region 652, the n-type region 654, and the drift region 656 when viewed along line A-A in FIG. 13 (in other words, when viewed along a thickness direction of the semiconductor substrate). As shown in FIG. 14, the electric field has a maximum value Ep2 at a p-n junction 658 between the RESURF region 652 and the n-type region 654. If the concentration of the n-type impurities in the n-type region 654 is high, the electric field Ep2 generated at the p-n junction 658 increases. In other words, a potential difference generated at the p-n junction 658 increases. If a voltage applied to the IGBT is constant, then a potential difference between an upper end position and a lower end position of the line A-A is approximately constant. Therefore, if the potential difference generated at the p-n junction 658 increases, the potential difference generated in other regions on the line A-A decreases. Accordingly, an electric field Eu2 (refer to FIG. 14) generated at the upper end of the RESURF region 652 also decreases. As a result, a localized high electric field is less likely to be generated within the RESURF region 652 when the electric charge adheres to the upper surface of the peripheral region 650. In other words, if the concentration of the n-type impurities in the n-type region 654 is high, the localized electric field concentration is less likely to occur within the RESURF region 652 when the electric charge adheres to the upper surface of the peripheral region 650.

However, in a case where the n-type region 654 with the high concentration of the n-type impurities is formed by implanting the n-type impurities to a depth of the n-type region 654, since the n-type impurities are to be implanted with high energy, a large number of crystal defects end up being formed within the peripheral region 650. Therefore, in the peripheral region 650, current leakage becomes likely to occur. On the other hand, in a case where the n-type region 654 is formed by implanting the n-type impurities into a region in the vicinity of the surface of the semiconductor substrate and by diffusing the n-type impurities, the concentration of the n-type impurities in the n-type region 654 cannot be increased so much.

Moreover, while a semiconductor apparatus in which the IGBT is formed in the device region has been described in the example above, the RESURF region can also be formed within the peripheral region in a semiconductor apparatus in which a MOSFET or a diode is formed within the device region. Even in this case, the same problem as in the semiconductor apparatus shown in FIG. 13 occurs.

In consideration thereof, this specification provides a technique capable of forming a region with a high concentration of impurities under a surface region (in the example above, the RESURF region) of a peripheral region without forming so many crystal defects in the peripheral region.

A semiconductor apparatus disclosed in this specification includes a semiconductor substrate. The semiconductor substrate includes a device region in which a vertical type semiconductor device is formed and a peripheral region located around the device region. A first semiconductor region is formed within the device region. The first semiconductor region is of a first conductivity type and is exposed at an upper surface of the semiconductor substrate. A second semiconductor region, a third semiconductor region, and a fourth semiconductor region are formed within the peripheral region. The second semiconductor region is of the first conductivity type, has a concentration of first conductivity type impurities lower than a concentration of the first conductivity type impurities in the first semiconductor region, is exposed at the upper surface of the semiconductor substrate, and is consecutive with the first semiconductor region directly or via another semiconductor region having the first conductivity type. The third semiconductor region is of a second conductivity type, is in contact with the second semiconductor region from an underside, and is an epitaxial layer. The fourth semiconductor region is of the second conductivity type, has a concentration of second conductivity type impurities lower than a concentration of the second conductivity type impurities in the third semiconductor region, and is in contact with the third semiconductor region from an underside.

Moreover, one of the "first conductivity type" and the "second conductivity type" described above signifies an n-type and the other signifies a p-type. In other words, when the "first conductivity type" signifies the n-type, the "second conductivity type" signifies the p-type. When the "first conductivity type" signifies the p-type, the "second conductivity type" signifies the n-type. In addition, in this specification, "exposed at the upper surface of the semiconductor substrate" signifies that an object region is exposed at the upper surface of the semiconductor substrate when ignoring portions other than a semiconductor (an electrode, an insulating layer, and the like) formed on the upper surface of the semiconductor substrate. Therefore, even if the object region is covered by an electrode or an insulating layer, such a state is included in the description "exposed at the upper surface of the semiconductor substrate".

In the above mentioned semiconductor apparatus disclosed in this specification, the second semiconductor region is a region exposed at the upper surface in the peripheral region (the RESURF region is an example of the second semiconductor region). In this semiconductor apparatus, the third semiconductor region (a region in which the concentration of the second conductivity type impurities is high) under the second semiconductor region is the epitaxial layer. Epitaxial growth enables formation of the third semiconductor region with the high concentration of the second conductivity type impurities without forming hardly any crystal defects within the peripheral region. Therefore, degradation of breakdown voltage characteristics of the semiconductor apparatus is less likely to occur even if an electric charge adheres to the upper surface of the peripheral region.

This specification provides a method for manufacturing a semiconductor apparatus. The method is configured for manufacturing a semiconductor apparatus including a device region in which a vertical type semiconductor device is formed and a peripheral region located around the device region. The method includes growing an epitaxial layer on a base semiconductor layer, forming a second semiconductor region within the peripheral region by implanting first conductivity type impurities into the epitaxial layer within the peripheral region, and forming a first semiconductor region within the device region by implanting the first conductivity type impurities into the epitaxial layer within the device region. The base semiconductor layer is of a second conductivity type, and the epitaxial layer is of the second conductivity type and has a concentration of second conductivity type impurities higher than a concentration of the second conductivity type impurities in the base semiconductor layer. The second semiconductor region is of the first conductivity type and is exposed at an upper surface of the epitaxial layer, and a lower end of the second semiconductor region does not reach the base semiconductor layer. The first semiconductor region is of the first conductivity type and is exposed at the upper surface of the epitaxial layer. The first semiconductor region and the second semiconductor region are formed so that a concentration of the first conductivity type impurities in the second semiconductor region is lower than a concentration of the first conductivity type impurities in the first semiconductor region.

According to this method, the second semiconductor region is formed so that the lower end of the second semiconductor region does not reach the base semiconductor layer. Therefore, the epitaxial layer that is of the second conductivity type remains under the second semiconductor region (in other words, between the second semiconductor region and the base semiconductor layer). The epitaxial layer under the second semiconductor region has the concentration of the second conductivity type impurities higher than the concentration of the second conductivity type impurities in the base semiconductor layer. Therefore, according to this method, a structure is obtained in which the epitaxial layer that is of the second conductivity type is located under the second semiconductor region that is of the first conductivity type, and the base semiconductor layer which has the low concentration of the second conductivity type impurities and which is of the second conductivity type is located under the epitaxial layer. Consequently, according to this method, a semiconductor apparatus less likely to be affected by the adherence of the electric charge to the upper surface of the peripheral region can be manufactured without forming hardly any crystal defects within the peripheral region.

DETAILED DESCRIPTION

Figure 1:
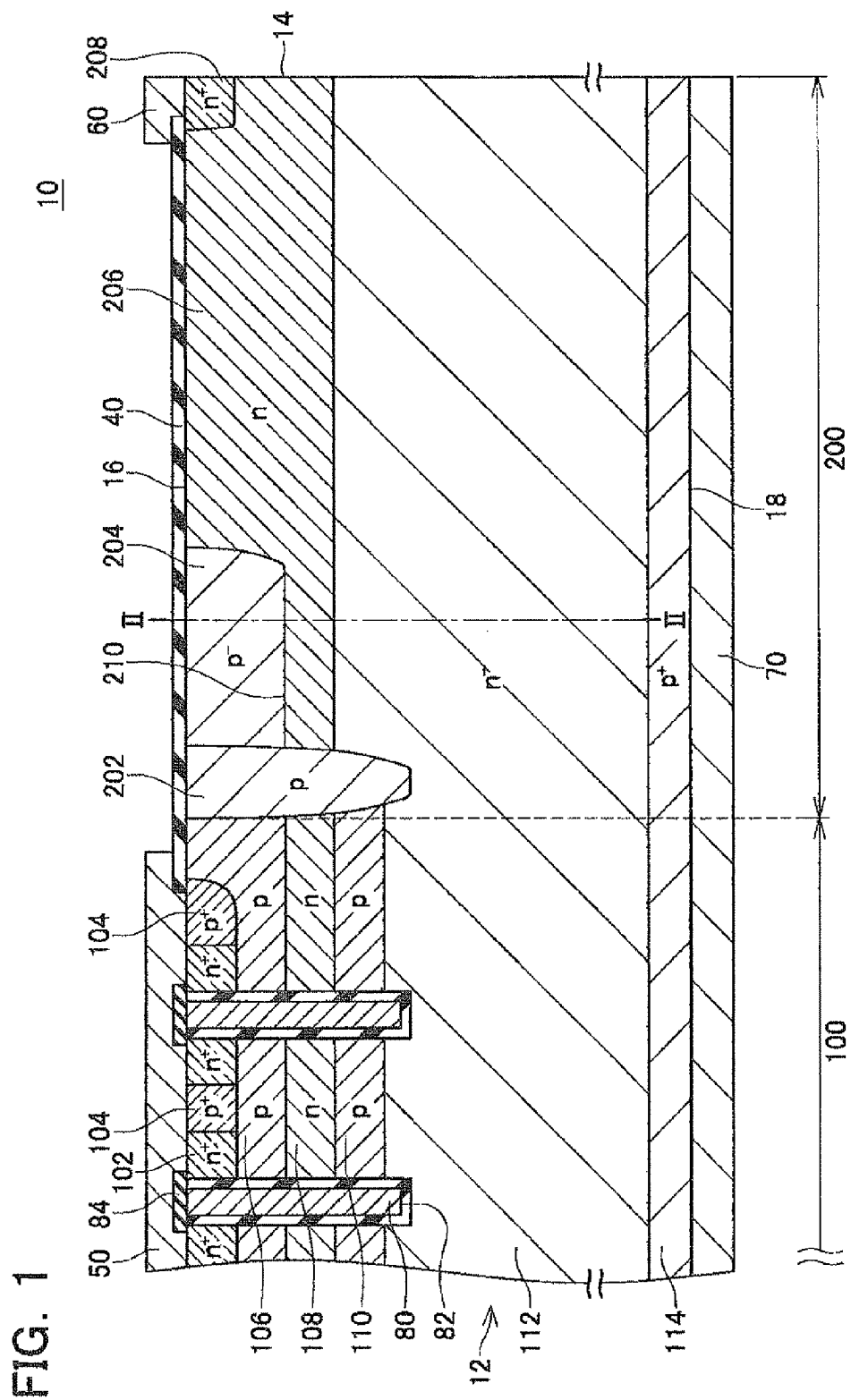
FIG. 1 is a longitudinal sectional view of a semiconductor apparatus 10 according to a first embodiment.

In one aspect of the present teachings, it may be preferred that a fifth semiconductor region is formed within the peripheral region in the above mentioned semiconductor apparatus. The fifth semiconductor region is of the second conductivity type, has a concentration of the second conductivity type impurities lower than the concentration of the second conductivity type impurities in the third semiconductor region, is exposed at the upper surface of the semiconductor substrate, is located between the second semiconductor region and a side surface of the semiconductor substrate, and is in contact with the second semiconductor region from a lateral side.

As seen above, when the fifth semiconductor region (a second conductivity type region) which is in contact with the second semiconductor region from the lateral side has the low concentration of the second conductivity type impurities, a high electric field is unlikely to occur at a p-n junction between the second semiconductor region and the fifth semiconductor region. The p-n junction is located in a vicinity of the upper surface of the peripheral region. Therefore, by suppressing the electric field generated at the p-n junction, degradation of breakdown voltage characteristics due to an electric charge adhering to the upper surface of the peripheral region is even less likely to occur.

In another aspect of the present teachings, it may be preferred that a maximum value of the concentration of the first conductivity type impurities in the second semiconductor region is higher than a maximum value of the concentration of the second conductivity type impurities in the third semiconductor region.

According to such a configuration, a depletion layer generated from a p-n junction between the second semiconductor region and the third semiconductor region is more likely to extend toward a side of the third semiconductor region, and the breakdown voltage characteristics are improved.

In another aspect of the present teachings, it may be preferred that a sixth semiconductor region is formed within the device region. The sixth semiconductor region is of the second conductivity type, is located under the first semiconductor region, and is an epitaxial layer.

As seen above, if the sixth semiconductor region under the first semiconductor region is an epitaxial layer, a concentration of the second conductivity type impurities in the sixth semiconductor region can be higher. Therefore, a concentration of impurities in a region located around the sixth semiconductor region is less likely to affect characteristics of the sixth semiconductor region and the sixth semiconductor region can be formed in a stable manner. Therefore, when the semiconductor apparatus is produced in large quantities, characteristic variation among the mass-produced semiconductor apparatuses can be reduced.

Further, in another aspect of the present teachings, in the above mentioned method, it may be preferred that first semiconductor region is formed so that a lower end of the first semiconductor region does not reach the base semiconductor layer.

According to such a constitution, the epitaxial layer that is of the second conductivity type remains under the first semiconductor region. Therefore, when the semiconductor apparatus is produced in large quantities, characteristic variation among the mass-produced semiconductor apparatuses can be reduced.

In addition, in another aspect of the present teachings, the growing the epitaxial layer may include growing, on the base semiconductor layer, a first epitaxial layer that is of the second conductivity type and growing, on the first epitaxial layer, a second epitaxial layer which is of the second conductivity type and which has a concentration of the second conductivity type impurities that differs from the concentration of the second conductivity type impurities in the first epitaxial layer. In this manner, two epitaxial layers may be formed on the base semiconductor layer.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor apparatuses, as well as methods for using and manufacturing the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

As shown in FIG. 1, a semiconductor apparatus 10 comprises a semiconductor substrate 12. The semiconductor substrate 12 comprises a device region 100 and a peripheral region 200. The device region 100 is formed at a central part of the semiconductor substrate 12 in a plan view of the semiconductor substrate 12. The peripheral region 200 is formed so as to encompass the device region 100. In other words, the peripheral region 200 is formed between the device region 100 and a side surface 14 of the semiconductor substrate 12. A vertical IGBT is formed in the device region 100. The peripheral region 200 is a region for securing a breakdown voltage between the device region 100 and the side surface 14.

An emitter electrode 50 and an outer peripheral electrode 60 are formed on an upper surface 16 of the semiconductor substrate 12. The emitter electrode 50 is formed within the device region 100. The outer peripheral electrode 60 is formed on the peripheral region 200. The outer peripheral electrode 60 extends along the side surface 14 of the semiconductor substrate 12. An insulating layer 40 is formed on the upper surface 16 of the semiconductor substrate 12 between the emitter electrode 50 and the outer peripheral electrode 60. A collector electrode 70 is formed on a lower surface 18 of the semiconductor substrate 12. The collector electrode 70 is formed across the entire lower surface 18.

A plurality of trenches is formed on the upper surface 16 of the semiconductor substrate 12 within the device region 100. An inner surface of each trench is covered by a gate insulating film 82. A gate electrode 80 is formed inside each trench. An upper surface of each gate electrode 80 is covered by an interlayer insulating film 84. The gate electrode 80 is insulated from the emitter electrode 50. An emitter region 102, a body contact region 104, an upper body region 106, a stopper region 108, a lower body region 110, a drift region 112, and a collector region 114 are formed inside the semiconductor substrate 12 within the device region 100.

The emitter region 102 is formed in a range that is exposed at the upper surface 16 of the semiconductor substrate 12. Each emitter region 102 is formed in a range that is in contact with the gate insulating film 82. Each emitter region 102 is an n-type region having a high concentration of n-type impurities. Each emitter region 102 is ohmically connected to the emitter electrode 50.

The body contact region 104 is formed in a range that is exposed at the upper surface 16 of the semiconductor substrate 12. The body contact region 104 is adjacent to the emitter region 102. The body contact region 104 is a p-type region containing a high concentration of p-type impurities. Each body contact region 104 is ohmically connected to the emitter electrode 50.

The upper body region 106 is formed under the emitter region 102 and the body contact region 104. The upper body region 106 is in contact with the gate insulating film 82. The upper body region 106 is a p-type region which has a concentration of the p-type impurities lower than the concentration of the p-type impurities in the body contact region 104.

The stopper region 108 is formed under the upper body region 106. The stopper region 108 is separated from each emitter region 102 by the upper body region 106. The stopper region 108 is in contact with the gate insulating film 82. The stopper region 108 is an n-type region which has a concentration of the n-type impurities lower than the concentration of the n-type impurities in the emitter region 102.

The lower body region 110 is formed under the stopper region 108. The lower body region 110 is separated from the upper body region 106 by the stopper region 108. The lower body region 110 is a p-type region which has a concentration of the p-type impurities lower than the concentration of the p-type impurities in the body contact region 104 (a concentration approximately equal to the concentration in the upper body region 106).

The drift region 112 is formed under the lower body region 110. The drift region 112 is separated from the stopper region 108 by the lower body region 110. The drift region 112 extends transversely and reaching the peripheral region 200. The aforementioned trenches are formed to a depth that reaches the drift region 112 by penetrating the upper body region 106, the stopper region 108, and the lower body region 110. Therefore, the drift region 112 is in contact with a lower end of the gate insulating film 82. The drift region 112 is an n-type region which has a concentration of the n-type impurities lower than the concentrations of the n-type impurities in the emitter region 102 and the stopper region 108.

The collector region 114 is formed under the drift region 112. The collector region 114 is formed in a range that is exposed at the lower surface 18 of the semiconductor substrate 12. The collector region 114 extends transversely and reaching the peripheral region 200. The collector region 114 is a p-type region containing a high concentration of the p-type impurities. The collector region 114 is ohmically connected to the collector electrode 70.

A vertical IGBT in which a current flows from the lower surface 18 to the upper surface 16 is formed by the emitter electrode 50, the collector electrode 70, the gate electrode 80, the gate insulating film 82, the emitter region 102, the body contact region 104, the upper body region 106, the stopper region 108, the lower body region 110, the drift region 112, and the collector region 114 described above.

A termination region 202, a RESURF region 204, a peripheral n-type region 206, and an outer peripheral contact region 208 are formed inside the semiconductor substrate 12 within the peripheral region 200.

The termination region 202 is formed in a depth range between the upper surface 16 of the semiconductor substrate 12 to a depth deeper than a lower end of the lower body region 110. The termination region 202 extends along a boundary between the device region 100 and the peripheral region 200.

The termination region 202 is in contact with the upper body region 106, the stopper region 108, and the lower body region 110. The termination region 202 is a p-type region which has a concentration of the p-type impurities higher than the concentration of the p-type impurities in the upper body region 106.

The RESURF region 204 is formed in a range that is exposed at the upper surface 16 of the semiconductor substrate 12. The RESURF region 204 is adjacent to the termination region 202. The RESURF region 204 is a p-type region which has a concentration of the p-type impurities lower than the concentration of the p-type impurities in the upper body region 106. The RESURF region 204 is consecutive with the body contact region 104 (a p-type region conductive with the emitter electrode 50) via the termination region 202 and the upper body region 106 (both are p-type regions).

The peripheral n-type region 206 is formed under and on a lateral side of the RESURF region 204. The peripheral n-type region 206 is exposed at the upper surface 16 of the semiconductor substrate 12 at a position adjacent to the RESURF region 204. In addition, the peripheral n-type region 206 is exposed at the side surface 14 of the semiconductor substrate 12. A position of a lower end of the peripheral n-type region 206 is approximately equal to a position of a lower end of the stopper region 108. The drift region 112 and the collector region 114 described above are formed under the peripheral n-type region 206. The peripheral n-type region 206 is a region formed by epitaxial growth. The peripheral n-type region 206 is an n-type region which has a concentration of the n-type impurities higher than the concentration of the n-type impurities in the drift region 112.

The outer peripheral contact region 208 is formed exposed at an outer end of the upper surface 16 of the semiconductor substrate 12. The outer peripheral contact region 208 is an n-type region having a high concentration of the n-type impurities. The outer peripheral contact region 208 is ohmically connected to the outer peripheral electrode 60.

Next, an operation of the IGBT will be described. When turning on the IGBT, a potential equal to or exceeding a threshold value (a minimum potential necessary to form a channel) is applied to the gate electrode 80 in a state where a voltage that positively charges the collector electrode 70 is applied between the collector electrode 70 and the emitter electrode 50. Consequently, due to the application of the potential to the gate electrode 80, the upper body region 106 and the lower body region 110 in ranges that are in contact with the gate insulating film 82 invert to the n-type, and channels are formed in those ranges. As a result, electrons flow from the emitter electrode 50 to the collector electrode 70 via the emitter region 102, the channel in the upper body region 106, the stopper region 108, the channel in the lower body region 110, the drift region 112, and the collector region 114. In addition, holes flow from the collector electrode 70 into the drift region 112 via the collector region 114. The holes flowed into the drift region 112 flow to the emitter electrode 50 via the lower body region 110, the stopper region 108, the upper body region 106, and the body contact region 104. When holes flow into the drift region 112, a conductivity modulation phenomenon occurs within the drift region 112 and an electric resistance of the drift region 112 decreases. Therefore, electrons are able to flow within the drift region 112 with low loss. Accordingly, the current flows from the collector electrode 70 to the emitter electrode 50. In other words, the IGBT turns on. In particular, with this IGBT, since a p-n junction between the stopper region 108 and the upper body region 106 acts as a barrier to the flow of holes, the holes are less likely to flow from the stopper region 108 to the upper body region 106. Consequently, many holes accumulate within the drift region 112 and the electric resistance of the drift region 112 further decreases. Therefore, the IGBT has a low on-resistance.

When the potential of the gate electrode 80 is lowered to or below the threshold value, the channel within the upper body region 106 and the channel within the lower body region 110 disappear. Accordingly, the flows of electrons and holes in the IGBT are suspended and the IGBT turns off.

Within the device region 100, in a state where the IGBT is off, the voltage applied between the collector electrode 70 and the emitter electrode 50 is applied to a p-n junction at a boundary between the lower body region 110 and the drift region 112. As a result, a depletion layer spreads from the p-n junction into the drift region 112. A breakdown voltage of the IGBT is secured by the depletion layer while the IGBT is off.

Within the peripheral region 200, in the state where the IGBT is off, the voltage applied between the collector electrode 70 and the emitter electrode 50 is applied to a p-n junction 210 between the RESURF region 204 and the peripheral n-type region 206. As a result, the depletion layer spreads from the p-n junction 210. The depletion layer spreads into the peripheral n-type region 206 and the drift region 112. The depletion layer also spreads into the RESURF region 204. The RESURF region 204 promotes extension of the depletion layer toward a side of the side surface 14 of the semiconductor substrate 12. Accordingly, localized thinning of the depletion layer in a vicinity of the device region 100 is suppressed. In other words, a localized electric field concentration in the vicinity of the device region 100 is suppressed.

Figure 2:
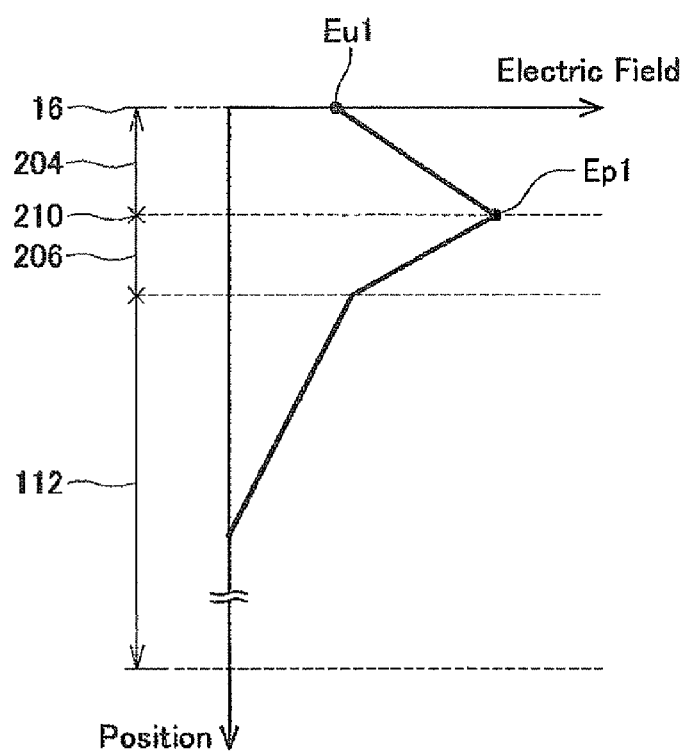
FIG. 2 is a graph showing an electric field distribution along line II-II in FIG. 1.

As described above, in the peripheral region 200, in the state where the IGBT is off, the RESURF region 204, the peripheral n-type region 206, and the drift region 112 are depleted. Therefore, an electric field is generated within these regions. FIG. 2 shows an electric field distribution within the RESURF region 204, the peripheral n-type region 206, and the drift region 112 when viewed along line II-II in FIG. 1. As shown in FIG. 2, the electric field at an upper end of the RESURF region 204 (in other words, the upper surface 16 of the semiconductor substrate 12) is an electric field Eu1. The electric field increases in a downward direction from the upper end of the RESURF region 204, and reaches a peak value Ep1 at the p-n junction 210 between the RESURF region 204 and the peripheral n-type region 206. In a region on an underside of the p-n junction 210, the electric field decreases in a downward direction. A rate of decrease of the electric field is smaller in the drift region 112 than in the peripheral n-type region 206. This is because the concentration of the n-type impurities in the drift region 112 is low.

When the electric field Eu1 generated at the upper end of the RESURF region 204 is larger, if an electric charge or the like adheres to the upper surface of the peripheral region 200, a significant disturbance in the electric field occurs within the RESURF region 204. However, with this semiconductor apparatus 10, the electric field Eu1 generated at the upper end of the RESURF region 204 is suppressed. A reason thereof will be given below.

Figure 3:
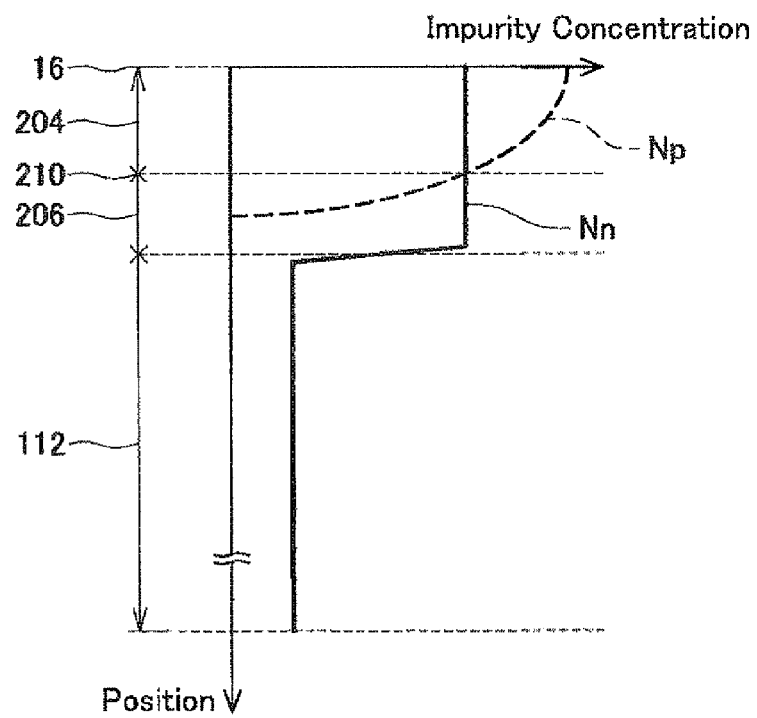
FIG. 3 is a graph showing a distribution of impurity concentration along line II-II in FIG. 1.

FIG. 3 shows a distribution of impurity concentration within the RESURF region 204, the peripheral n-type region 206, and the drift region 112 when viewed along line in FIG. 1. A line Np represents the concentration of the p-type impurities and a line Nn represents the concentration of the n-type impurities. As shown, within the drift region 112, the concentration of the n-type impurities Nn has an approximately constant low value. This is because the drift region 112 is a region constituted by an n-type semiconductor wafer. In addition, within the RESURF region 204 and the peripheral n-type region 206, the concentration of the n-type impurities Nn has an approximately constant relatively high value. This is because the RESURF region 204 and the peripheral n-type region 206 are regions formed by growing an n-type epitaxial layer on the semiconductor wafer; that is, the RESURF region 204 and the peripheral n-type region 206 are an epitaxial layer. By forming the RESURF region 204 and the peripheral n-type region 206 by epitaxial growth, the concentration of the n-type impurities Nn in the RESURF region 204 and the peripheral n-type region 206 can be set constant at a high value. The concentration of the p-type impurities Np is highest at the upper end of the RESURF region 204, and the further downward, the lower the concentration of the p-type impurities Np. This is because the RESURF region 204 is formed by implanting p-type impurities in a region in a vicinity of a surface of the epitaxial layer and then diffusing the implanted p-type impurities.

As described above, the peripheral n-type region 206 has the high concentration Nn of the n-type impurities. If the concentration Nn of the n-type impurities within the peripheral n-type region 206 is higher, the electric field generated at the p-n junction 210 between the RESURF region 204 and the peripheral n-type region 206 while the IGBT is off becomes higher. In other words, the electric field peak value Ep1 shown in FIG. 2 becomes higher. Therefore, the potential difference generated in the vicinity of the p-n junction 210 becomes higher. If the potential difference generated in the vicinity of the p-n junction 210 becomes higher, the potential difference generated within the regions other than the vicinity of the p-n junction 210 on the line II-II becomes lower. Therefore, in this semiconductor apparatus 10, the electric field Eu generated at the upper end of the RESURF region 204 is small. Consequently, even if the electric charge or the like adheres to the surface of the peripheral region 200, the electric field disturbance that occurs within the RESURF region 204 is small and thus the localized electric field concentration is less likely to occur within the RESURF region 204.

Figure 4:
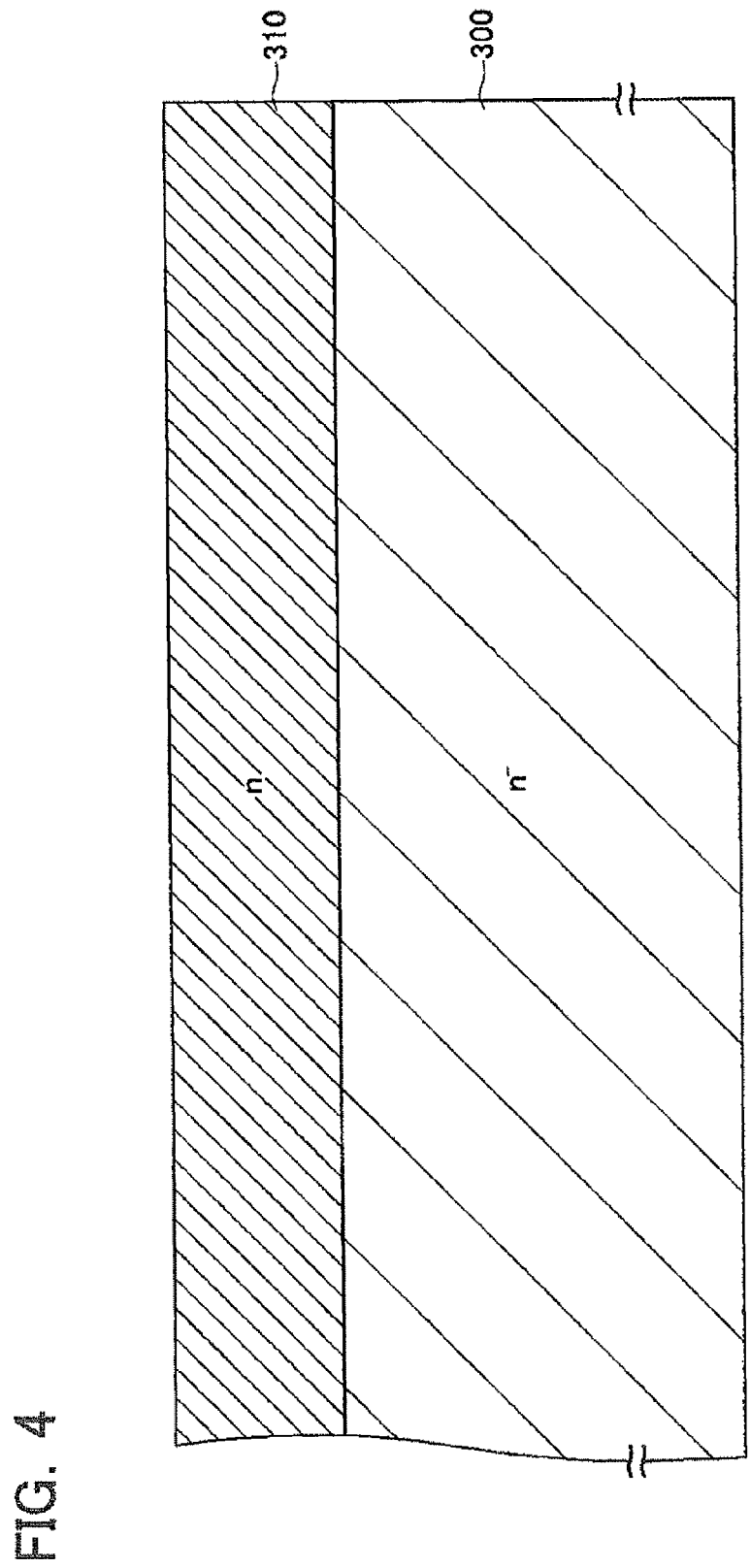
FIG. 4 is a longitudinal sectional view of a semiconductor wafer in a manufacturing process of the semiconductor apparatus 10.
Figure 5:
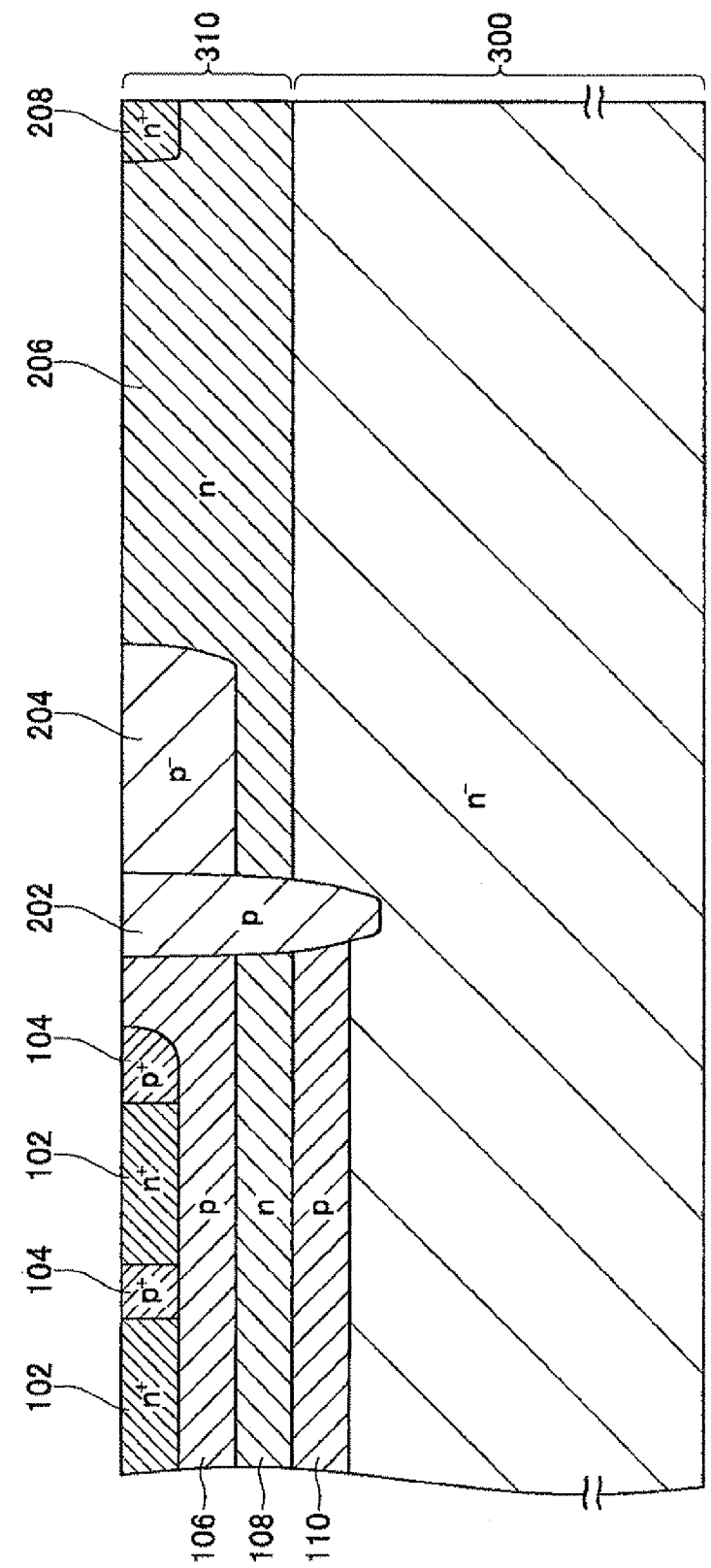
FIG. 5 is a longitudinal sectional view of a semiconductor wafer in a manufacturing process of the semiconductor apparatus 10.

Next, a method for manufacturing the semiconductor apparatus 10 will be described. The semiconductor apparatus 10 is manufactured from a semiconductor wafer having a concentration of the n-type impurities that is the same as the concentration of the n-type impurities in the drift region 112. First, as shown in FIG. 4, an n-type epitaxial layer 310 is grown on a semiconductor wafer 300. The epitaxial layer 310 is an n-type layer having a concentration of the n-type impurities that is the same as the concentration of the n-type impurities in the peripheral n-type region 206 and the stopper region 108. Next, by ion implantation and thermal diffusion, as shown in FIG. 5, the emitter region 102, the body contact region 104, the upper body region 106, the lower body region 110, the termination region 202, the RESURF region 204, and the outer peripheral contact region 208 are formed. The RESURF region 204 is formed by implanting p-type impurities in a vicinity of an upper surface of the epitaxial layer 310 and then thermally diffusing the p-type impurities. Accordingly, a distribution of the concentration of the p-type impurities in the RESURF region 204 becomes the distribution shown in FIG. 3. The RESURF region 204 is formed so that a lower end thereof does not reach the semiconductor wafer 300. The upper body region 106 is formed so that a lower end thereof does not reach the semiconductor wafer 300, a region in the epitaxial layer 310 within the device region 100 that did not become any of the emitter region 102, the body contact region 104, and the upper body region 106 becomes the stopper region 108. In addition, a region in the epitaxial layer 310 within the peripheral region 200 that did not become any of the termination region 202, the RESURF region 204, and the outer peripheral contact region 208 becomes the peripheral n-type region 206. Next, trenches are formed on the upper surface of the epitaxial layer 310 and the gate insulating film 82 and the gate electrode 80 are formed inside each trench. The interlayer insulating films 84 and the insulating layer 40 are then formed. Next, the emitter electrode 50 and the outer peripheral electrode 60 are formed. Accordingly, the upper surface-side structure of the semiconductor apparatus 10 is completed. Next, the collector region 114 is formed by ion implantation and thermal diffusion. The collector electrode 70 is then formed on a lower surface of the semiconductor wafer 300. Subsequently, by dicing the semiconductor wafer, the semiconductor apparatus 10 shown in FIG. 1 is completed.

Moreover, a sequence of steps in the manufacturing method described above can be modified as appropriate. For example, the ion implantation may be performed after forming the gate electrode 80, or a part of the ion implantation may be performed before forming the gate electrode 80 and a remainder of the ion implantation may be performed after forming the gate electrode 80.

As described above, with this semiconductor apparatus 10, the peripheral n-type region 206 under the RESURF region 204 is formed by epitaxial growth. The epitaxial growth can form the peripheral n-type region 206 having the high concentration of the n-type impurities. Accordingly, an electric field Eu that occurs at the upper end of the RESURF region 204 is suppressed. Therefore, with the semiconductor apparatus 10, even if the electric charge adheres to the upper surface of the peripheral region 200, the electric field disturbance is less likely to occur within the peripheral region 200 and the localized electric field concentration is less likely to occur within the peripheral region 200. In addition, since the peripheral n-type region 206 with the high concentration of the n-type impurities is formed under the RESURF region 204 without implanting ions at positions deep within the peripheral region 200, just a few crystal defects exist within the peripheral region 200. Therefore, in this semiconductor apparatus 10, a leakage current is less likely to be generated within the peripheral region 200. As described, in this semiconductor apparatus 10, the peripheral region 200 has superior breakdown voltage characteristics.

Furthermore, as described earlier, the stopper region 108 acts as a barrier for accumulating holes within the drift region 112 while the IGBT is on. Therefore, a concentration of the n-type impurities in the stopper region 108 significantly affects the on-voltage of the IGBT. In addition, the concentration of the n-type impurities in the stopper region 108 affects various characteristics of the IGBT including the threshold value of the gate potential (the minimum gate potential required for the channel formation) and feedback capacity. As described above, the stopper region 108 is formed by the epitaxial growth. The epitaxial growth can form the stopper region 108 with the high concentration of the n-type impurities. Therefore, an influence of a concentration of impurities in regions surrounding the stopper region 108 is reduced and the stopper region 108 can be formed in a stable manner. Therefore, when the semiconductor apparatus 10 is produced in large quantities, the variation in IGBT characteristics among the mass-produced semiconductor apparatuses 10 is less likely to occur.

Figure 6:
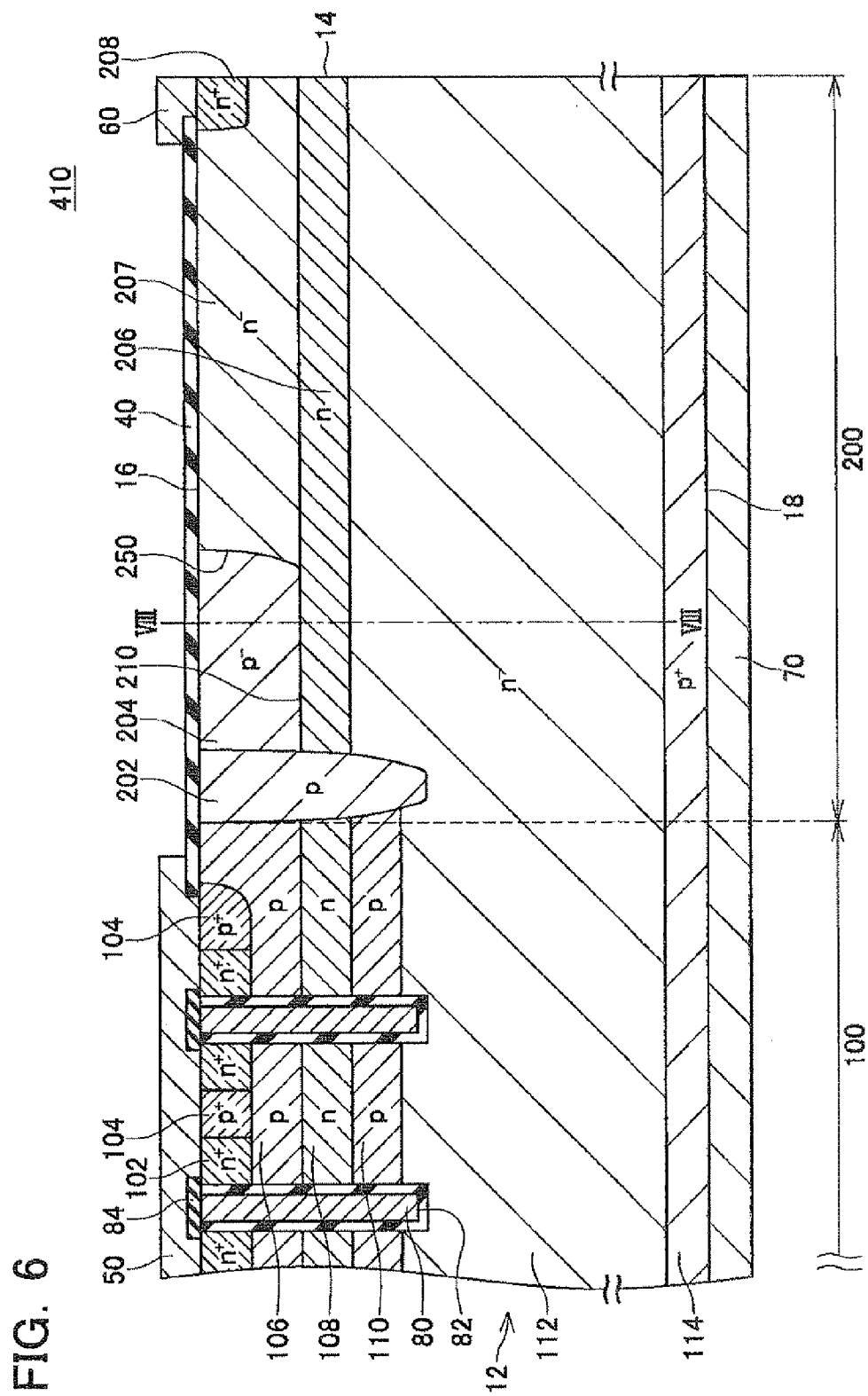
FIG. 6 is a longitudinal sectional view of a semiconductor apparatus according to a second embodiment.

Next, a semiconductor apparatus according to a second embodiment will be described. FIG. 6 shows a longitudinal sectional view of the semiconductor apparatus according to the second embodiment. In FIG. 6, portions having same functions as those shown in FIG. 1 are denoted by same reference numerals as those in FIG. 1. As shown in FIG. 6, in the semiconductor apparatus according to the second embodiment, a second peripheral n-type region 207 is formed in a range which is within a peripheral region 200 and which is exposed at an upper surface 16 of a semiconductor substrate 12. The peripheral n-type region 207 is formed adjacent to a RESURF region 204 on a side of a side surface 14 and is in contact with the RESURF region 204 from a lateral side. A concentration of n-type impurities in the peripheral n-type region 207 is lower than a concentration of the n-type impurities in a peripheral n-type region 206.

Since the concentration of the n-type impurities within the peripheral n-type region 207 is low as described above, a low electric field occurs at a p-n junction 250 between the RESURF region 204 and the peripheral n-type region 207 while the IGBT is off. As shown in FIG. 6, the p-n junction 250 reaches the upper surface 16 of the semiconductor substrate 12. Therefore, by suppressing the electric field at the p-n junction 250, an electric field in a vicinity of an upper surface of the peripheral region 200 can be suppressed. Accordingly, a disturbance of the electric field due to an adherence of an electric charge to the upper surface of the peripheral region 200 can be further suppressed.

Figure 7:
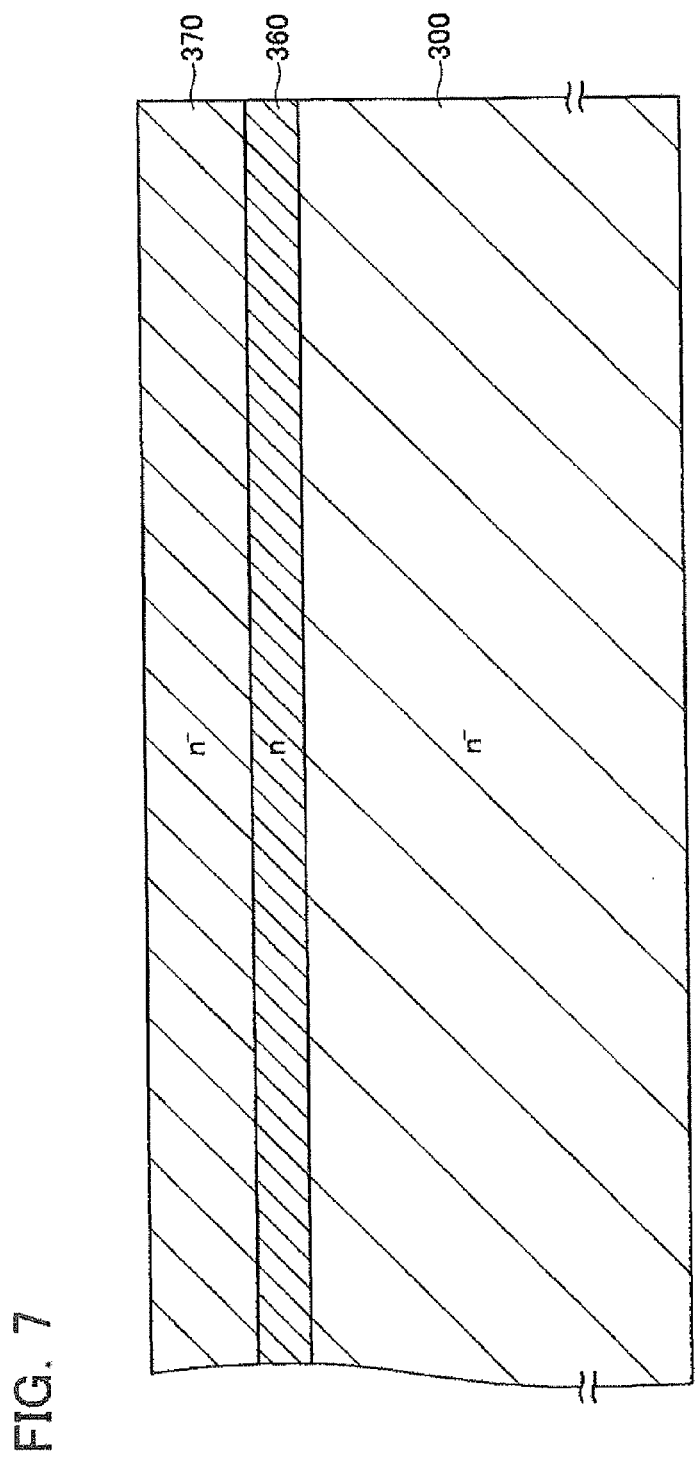
FIG. 7 is a longitudinal sectional view of a semiconductor wafer in a manufacturing process of the semiconductor apparatus.

The semiconductor apparatus according to the second embodiment is manufactured from an n-type semiconductor wafer 300 in a manner similar to the semiconductor apparatus 10 according to the first embodiment. In a method for manufacturing the semiconductor apparatus according to the second embodiment, as shown in FIG. 7, after an n-type epitaxial layer 360 is grown on the semiconductor wafer 300, an n-type epitaxial layer 370 is grown on the n-type epitaxial layer 360. A concentration of the n-type impurities in the epitaxial layer 360 is substantially the same as the concentration of the n-type impurities in the peripheral n-type region 206, and a concentration of the n-type impurities in the epitaxial layer 370 is substantially the same as the concentration of the n-type impurities in the peripheral n-type region 207. Subsequently, in a similar manner to the first embodiment, by forming the respective regions, the respective electrodes, and the respective insulating layers, the semiconductor apparatus according to the second embodiment can be manufactured.

Figure 8:
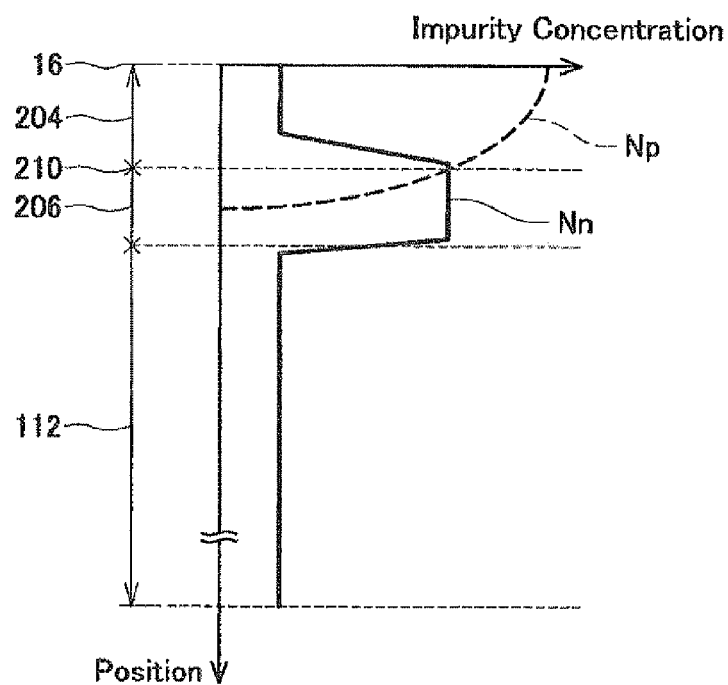
FIG. 8 is a graph showing a distribution of impurity concentration in an embodiment along line VIII-VIII in FIG. 6.

FIG. 8 shows a distribution of impurity concentration within the RESURF region 204, the peripheral n-type region 206, and the drift region 112 when viewed along line VIII-VIII in FIG. 6. Since the RESURF region 204 is formed by implanting p-type impurities into the epitaxial layer 370 that has the low concentration of the n-type impurities, the concentration of the n-type impurities in the RESURF region 204 is low. In the semiconductor apparatus according to the second embodiment, the peripheral n-type region 206 under the RESURF region 204 also has the high concentration of the n-type impurities. Therefore, with this semiconductor apparatus, a localized electric field concentration is less likely to occur even if the electric charge adheres to the surface of the peripheral region 200.

Figure 9:
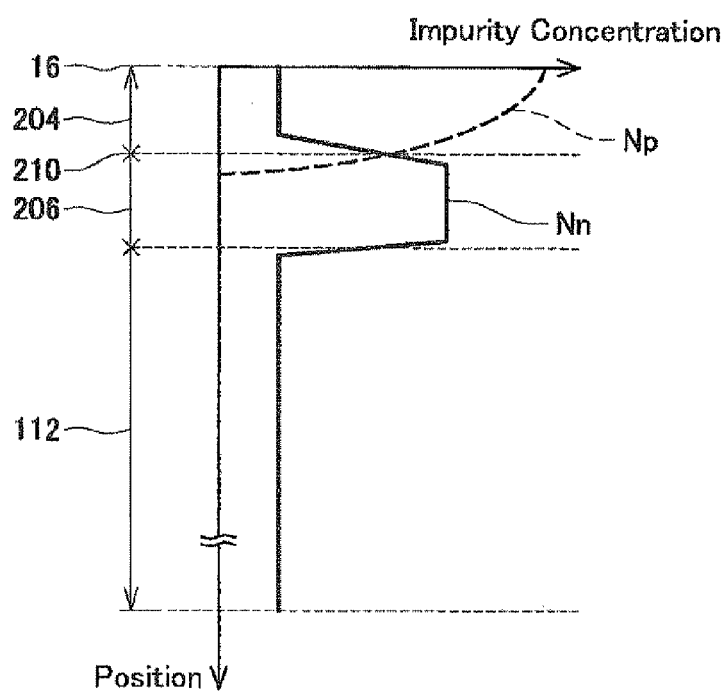
FIG. 9 is a graph showing a distribution of impurity concentration in another embodiment along line VIII-VIII in FIG. 6.

Moreover, with the semiconductor apparatus according to the second embodiment, as shown in FIG. 9, a graph of a concentration of the p-type impurities Np and a graph of a concentration of the n-type impurities Nn may intersect each other at a boundary between the epitaxial layer 360 and the epitaxial layer 370 (a portion where a concentration of the n-type impurities changes abruptly).

In addition, with the manufacturing method according to the second embodiment, while the concentration of the n-type impurities in the peripheral n-type region 206 can be set higher than a peak value of the concentration of the p-type impurities in the RESURF region 204, the concentration of the n-type impurities in the peripheral n-type region 206 is preferably lower than the peak value of the concentration of the p-type impurities in the RESURF region 204. As shown, by lowering the concentration of the n-type impurities in the peripheral n-type region 206, a depletion layer can expand more easily within the peripheral n-type region 206 and better breakdown voltage characteristics may be obtained.

While the semiconductor apparatuses according to the first and second embodiments have been described above, the above embodiments may be modified as described below.

In the embodiments described above, while the termination region 202 is formed along the boundary between the device region 100 and the peripheral region 200, the termination region 202 need not necessarily be formed. In this case, the RESURF region 204 can be located in contact with the upper body region 106.

Figure 10:
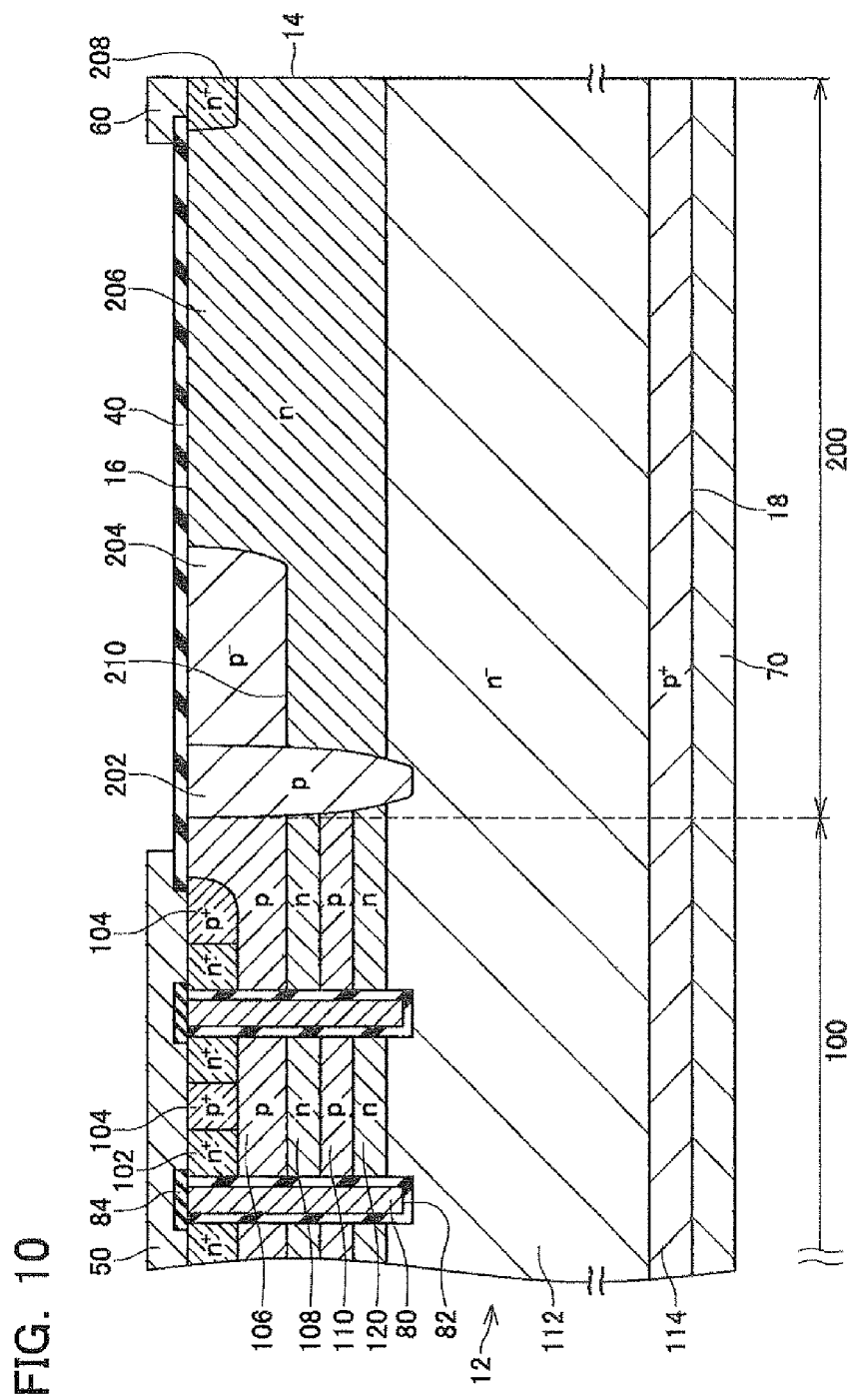
FIG. 10 is a longitudinal sectional view of a semiconductor apparatus according to an embodiment.

In the embodiments described above, while the lower body region 110 and the drift region 112 are in contact with each other, an n-type region 120 (a region which is an epitaxial layer and which has not been subjected to ion implantation) can be formed between the lower body region 110 and the drift region 112 as shown in FIG. 10. In other words, within the device region 100, a region other than the stopper region 108 may be constituted by an epitaxial layer.

In addition, in the embodiments described above, the IGBT includes the lower body region 110. However, the lower body region 110 may be omitted. In this case, the drift region 112 can be formed in contact with the stopper region 108. Furthermore, the stopper region 108 may be omitted. In this case, the drift region 112 can be formed in contact with the body region 106.

Figure 11:
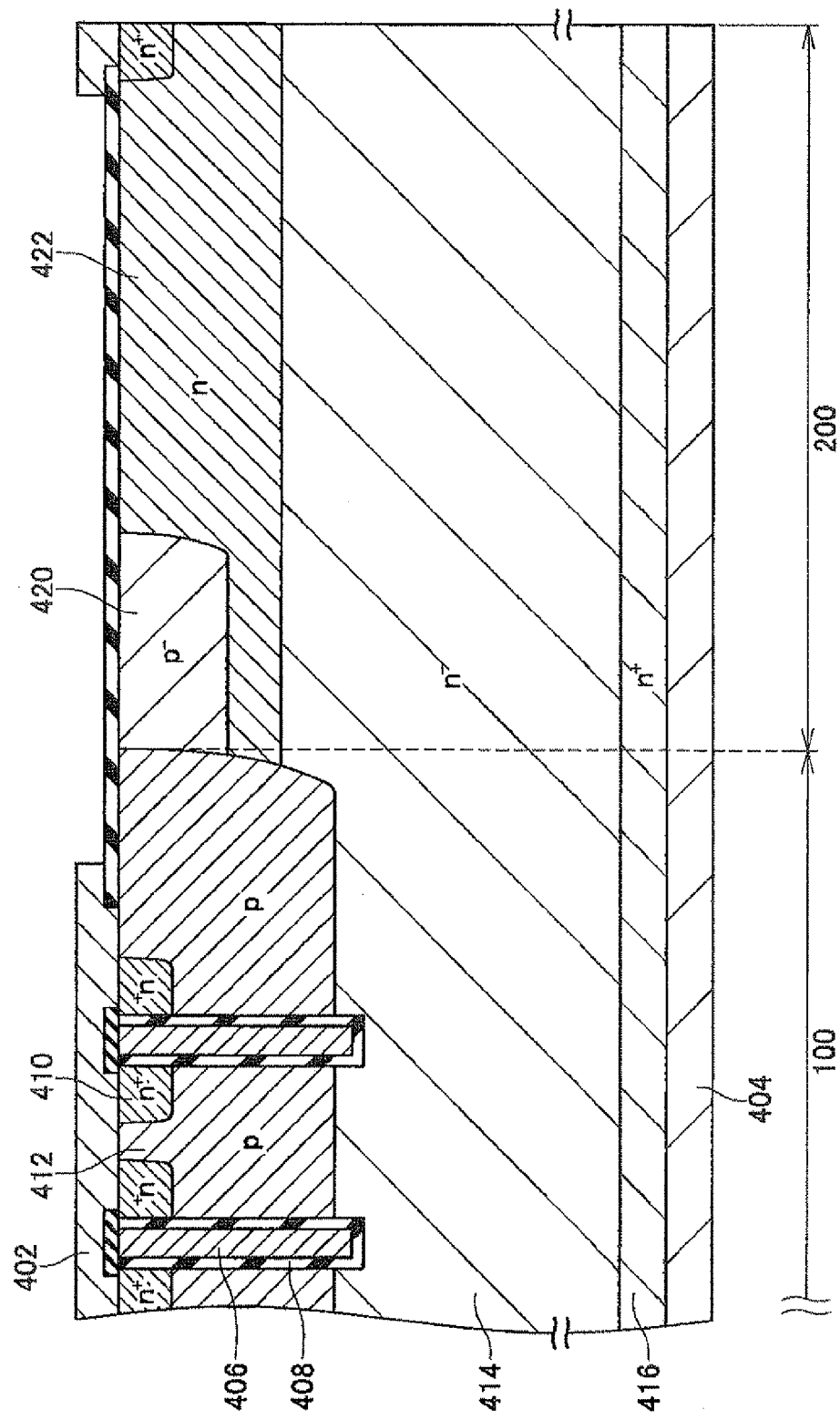
FIG. 11 is a longitudinal sectional view of a semiconductor apparatus in which a MOSFET is formed in a device region 100.
Figure 12:
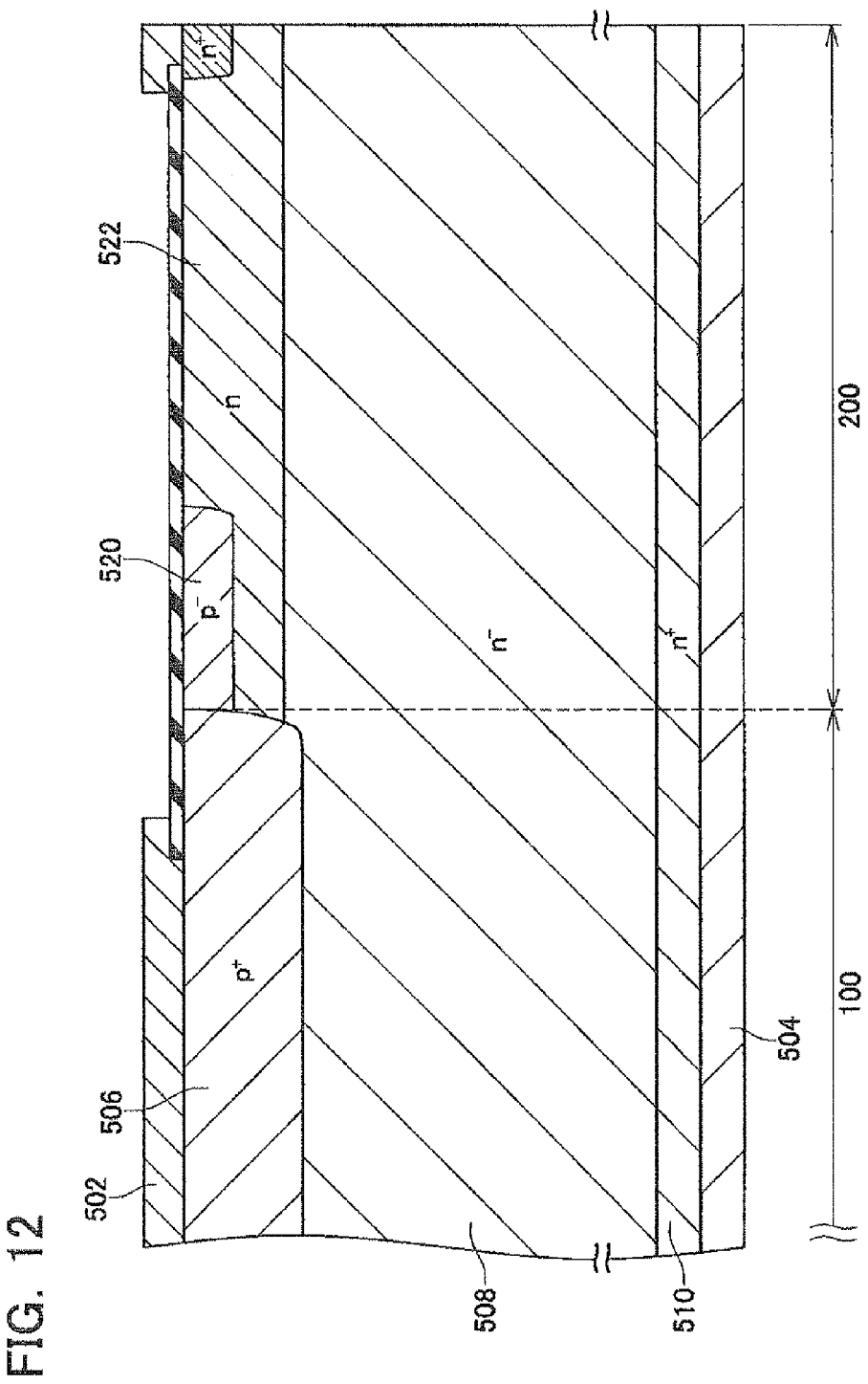
FIG. 12 is a longitudinal sectional view of a semiconductor apparatus in which a diode is formed in the device region 100.
Figure 13:
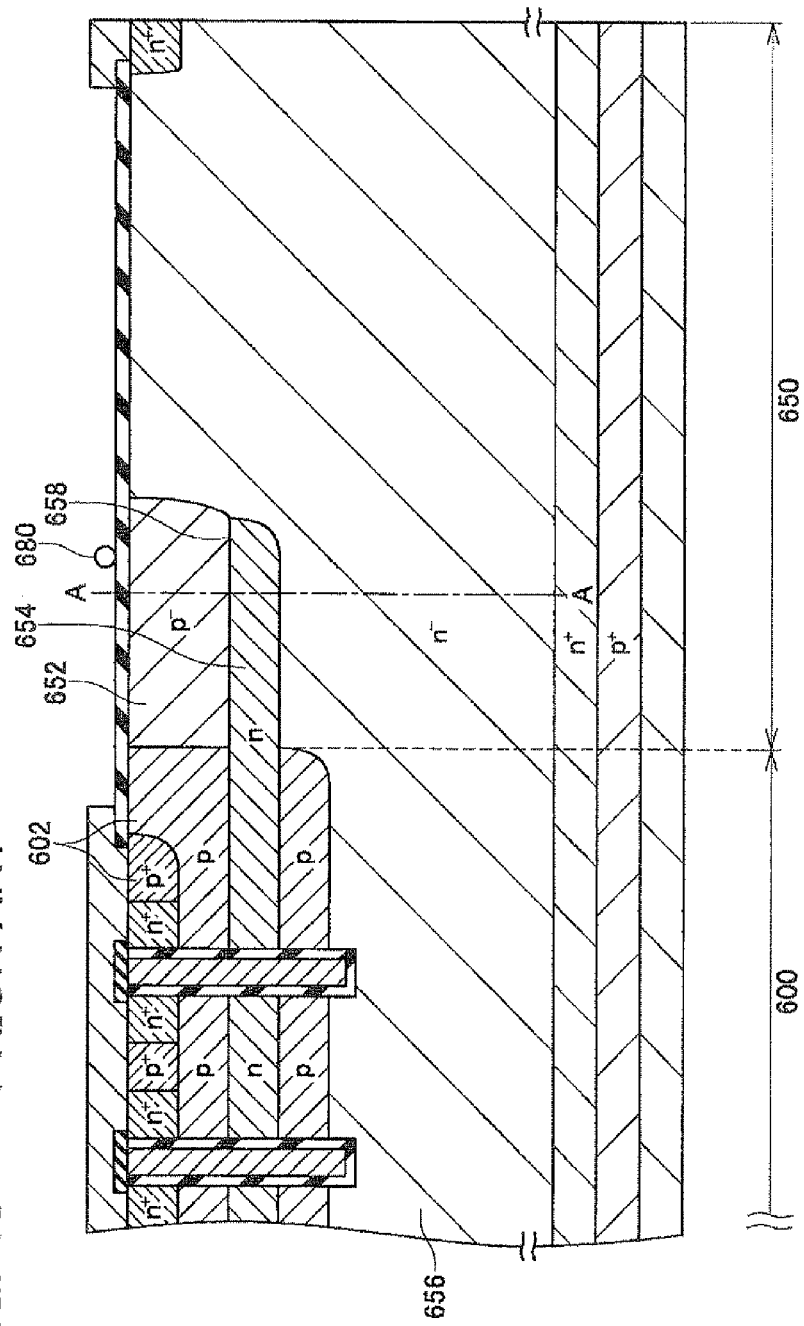
FIG. 13 is longitudinal sectional view of a semiconductor apparatus according to Japanese Patent Application Publication No. 2008-227238.
Figure 14:
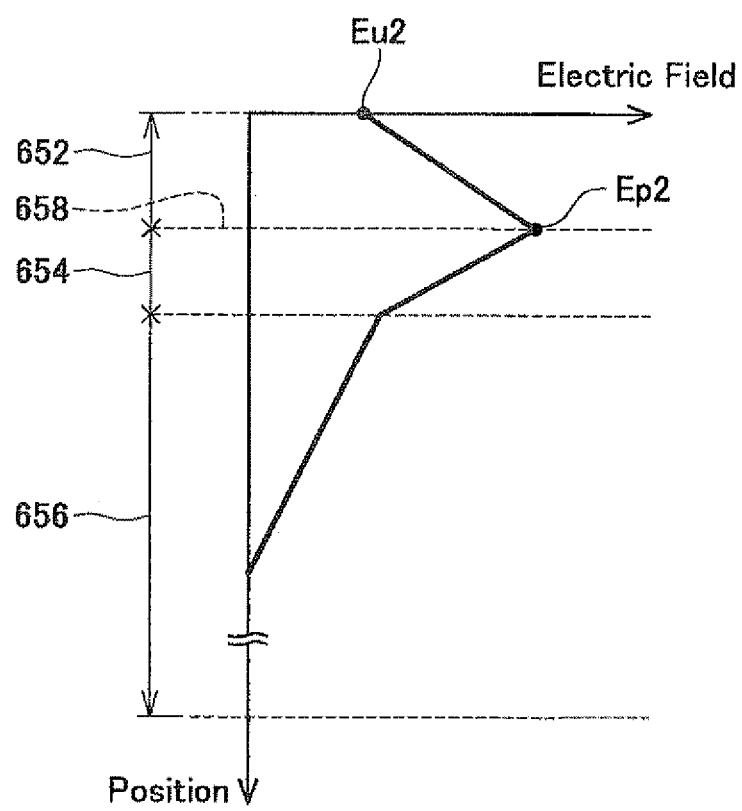
FIG. 14 is a graph showing a distribution of impurity concentration along line A-A in FIG. 13.

Furthermore, in the embodiments described above, while a semiconductor apparatus in which an IGBT is formed in the device region 100 has been described, other vertical type semiconductor devices (semiconductor devices in which a current flows from an upper surface to a lower surface or from the lower surface to the upper surface of a semiconductor substrate) such as an FET or a diode may be formed in the device region. FIG. 11 shows an example in which a MOSFET is formed within the device region 100. In a semiconductor apparatus shown in FIG. 11, a vertical MOSFET is constituted by a source electrode 402, a drain electrode 404, a gate electrode 406, a gate insulating film 408, a source region 410, a body region 412, a drift region 414, and a drain region 416. While the MOSFET is off, a reverse voltage is applied to a p-n junction between a RESURF region 420 and a peripheral n-type region 422 (a region which is formed by epitaxial growth and which has a concentration of n-type impurities that is higher than a concentration of the n-type impurities in the drift region 414), and a potential distribution within a peripheral region 200 becomes similar to that of the semiconductor apparatus 10 according to the first embodiment. In addition, FIG. 12 shows an example in which a diode is formed within the device region 100. In a semiconductor apparatus shown in FIG. 12, a diode is constituted by an anode electrode 502, a cathode electrode 504, an anode region 506, a drift region 508, and a cathode region 510. When a reverse voltage is applied the diode, a reverse voltage is applied to a p-n junction between a RESURF region 520 and a peripheral n-type region 522 (a region which is formed by epitaxial growth and which has a concentration of n-type impurities that is higher than a concentration of the n-type impurities in the drift region 508), and a potential distribution within a peripheral region 200 becomes similar to that of the semiconductor apparatus 10 according to the first embodiment. As described above, even if a device formed in the device region is an FBI or a diode, a similar advantage to that of the semiconductor apparatus 10 according to the first embodiment can be attained.

While preferred embodiments have been described using specific terms, such description is for illustrative purposes only and are not intended to limit the scope of the following claims. The techniques described in the claims include various modifications and changes made to the specific embodiments illustrated above.

The technical elements described in this specification or in the drawings exhibit technical utility singly or in various combinations and are not limited to the combinations recited in the claims as filed. Moreover, the techniques illustrated in this specification or in the drawings simultaneously attain a plurality of purposes, and attaining one of the purposes per se offers technical utility.

What is claimed is:

1. A semiconductor apparatus comprising a semiconductor substrate, wherein:
the semiconductor substrate comprises a device region in which a vertical type IGBT is formed and a peripheral region located around the device region,
an emitter region, a first semiconductor region, a stopper region, a drift region, a collector region, and a gate electrode are formed within the device region,
the emitter region is of an n-type and exposed at an upper surface of the semiconductor substrate;
the first semiconductor region is of a p-type, a part of the first semiconductor region is exposed at the upper surface of the semiconductor substrate, the first semiconductor region is in contact with the emitter region from an underside;
the stopper region is an epitaxial layer, of the n-type, in contact with the first semiconductor region from an underside, and separated from the emitter region by the first semiconductor region;
the drift region is of n-type and located under the stopper region, the drift region has a concentration of n-type impurities lower than a concentration of the n-type impurities in the stopper region;
the collector region is of p-type and in contact with the drift region from an underside; and
the gate electrode is in contact via an insulating film with the first semiconductor region in a range separating the stopper region from the emitter region,
a second semiconductor region, a third semiconductor region, and a fourth semiconductor region are formed within the peripheral region,
the second semiconductor region is of the p-type, has a concentration of p-type impurities lower than a concentration of the p-type impurities in the first semiconductor region, is exposed at the upper surface of the semiconductor substrate, and is consecutive with the first semiconductor region directly or via another semiconductor region having the p-type,
the third semiconductor region is an epitaxial layer, of the n-type, the third semiconductor region has a concentration of the n-type impurities equal to a concentration of the n-type impurities in the stopper region, the third semiconductor region is in contact with the second semiconductor region from an underside and extends such that it is exposed at the upper surface of the semiconductor substrate at a position adjacent to the second semiconductor region, and
the fourth semiconductor region is of the n-type, has a concentration of the n-type impurities lower than a concentration of the n-type impurities in the third semiconductor region, and is in contact with the third semiconductor region from an underside.

2. A semiconductor apparatus of claim 1, wherein
a fifth semiconductor region is formed within the peripheral region, and
the fifth semiconductor region is of the n-type, has a concentration of the n-type impurities lower than the concentration of the n-type impurities in the third semiconductor region, is exposed at the upper surface of the semiconductor substrate, is located between the second semiconductor region and a side surface of the semiconductor substrate, and is in contact with the second semiconductor region from a lateral side.

3. A semiconductor apparatus of claim 1, wherein the maximum value of the concentration of the p-type impurities in the second semiconductor region is higher than the maximum value of the concentration of the n-type impurities in the third semiconductor region.

4. A semiconductor apparatus of claim 1, wherein within the third semiconductor region the concentration of n-type impurities is approximately constant.

5. A semiconductor apparatus of claim 1, wherein within the second semiconductor region the concentration of n-type impurities is approximately constant.

6. A semiconductor apparatus of claim 1, wherein within the drift region the concentration of n-type impurities is approximately constant.

7. A semiconductor apparatus of claim 1, further comprising a termination region interposed between the third region and the stopper region.

8. A semiconductor apparatus comprising a semiconductor substrate, wherein:
the semiconductor substrate comprises a device region in which a vertical type IGBT is formed and a peripheral region located around the device region,
an emitter region, a first semiconductor region, a stopper region, a drift region, a collector region, and a gate electrode are formed within the device region,
the emitter region is of an n-type and exposed at an upper surface of the semiconductor substrate;
the first semiconductor region is of a p-type, a part of the first semiconductor region is exposed at the upper surface of the semiconductor substrate, the first semiconductor region is in contact with the emitter region from an underside;
the stopper region is an epitaxial layer, of the n-type, in contact with the first semiconductor region from an underside, and separated from the emitter region by the first semiconductor region;
the drift region is of n-type and located under the stopper region, the drift region has a concentration of n-type impurities lower than a concentration of the n-type impurities in the stopper region;
the collector region is of p-type and in contact with the drift region from an underside; and
the gate electrode is in contact via an insulating film with the first semiconductor region in a range separating the stopper region from the emitter region,
a second semiconductor region, a third semiconductor region, and a fourth semiconductor region are formed within the peripheral region,
the second semiconductor region is of the p-type, has a concentration of p-type impurities lower than a concentration of the p-type impurities in the first semiconductor region, is exposed at the upper surface of the semiconductor substrate, and is consecutive with the first semiconductor region directly or via another semiconductor region having the p-type,
the third semiconductor region is an epitaxial layer, of the n-type, the third semiconductor region has a concentration of the n-type impurities equal to a concentration of the n-type impurities in the stopper region, the third semiconductor region is in contact with the second semiconductor region from an underside, and a termination region interposed between the third region and the stopper region, and
the fourth semiconductor region is of the n-type, has a concentration of the n-type impurities lower than a concentration of the n-type impurities in the third semiconductor region, and is in contact with the third semiconductor region from an underside.

9. A semiconductor apparatus of claim 8, wherein
a fifth semiconductor region is formed within the peripheral region, and
the fifth semiconductor region is of the n-type, has a concentration of the n-type impurities lower than the concentration of the n-type impurities in the third semiconductor region, is exposed at the upper surface of the semiconductor substrate, is located between the second semiconductor region and a side surface of the semiconductor substrate, and is in contact with the second semiconductor region from a lateral side.

10. A semiconductor apparatus of claim 8, wherein the maximum value of the concentration of the p-type impurities in the second semiconductor region is higher than the maximum value of the concentration of the n-type impurities in the third semiconductor region.

11. A semiconductor apparatus of claim 8, wherein within the third semiconductor region the concentration of n-type impurities is approximately constant.

12. A semiconductor apparatus of claim 8, wherein within the second semiconductor region the concentration of n-type impurities is approximately constant.

13. A semiconductor apparatus of claim 8, wherein within the drift region the concentration of n-type impurities is approximately constant.

14. A semiconductor apparatus of claim 8, wherein the termination region is a p-type region.

* * * * *